United States Patent [19]

Fedder et al.

[11] E Patent Number: Re. 32,559

[45] Reissued Date of Patent: Dec. 15, 1987

[54] CARD EDGE CONNECTOR LOCKING DEVICE

[75] Inventors: James L. Fedder, Harrisburg; Attalee S. Taylor, Palmyra, both of Pa.

[73] Assignee: AMP Incorporated, Harrisburg, Pa.

[21] Appl. No.: 933,009

[22] Filed: Nov. 20, 1986

Related U.S. Patent Documents

Reissue of:

[64] Patent No.: 4,487,468
Issued: Dec. 11, 1984
Appl. No.: 453,653
Filed: Dec. 27, 1982

[51] Int. Cl.[4] ..... H01R 13/639
[52] U.S. Cl. ..... 439/325; 439/630
[58] Field of Search ..... 339/75 MP, 176 MP; 439/325–328, 629–637

[56] References Cited

U.S. PATENT DOCUMENTS

| | | | |
|---|---|---|---|
| 3,573,706 | 4/1971 | Haberlen | 339/17 L |
| 3,731,252 | 5/1973 | McKeown et al. | 339/17 L |
| 3,899,234 | 8/1975 | Yeager et al. | 339/75 MP |
| 3,970,353 | 7/1976 | Kaufman | 339/75 MP |
| 3,982,807 | 9/1976 | Anhalt et al. | 339/75 MP |
| 4,017,138 | 4/1977 | Evans | 339/75 MP |
| 4,076,362 | 2/1978 | Ichimura | 339/75 MP |
| 4,169,644 | 10/1979 | Bonhomme | 339/75 MP |
| 4,598,966 | 7/1986 | Boland | 339/176 MP |

*Primary Examiner*—John McQuade
*Attorney, Agent, or Firm*—Allan B. Osborne

[57] ABSTRACT

The invention is a locking device for locking circuit cards in zero-insertion force card edge connectors of the type having a vertically moving upper housing. More particularly, the locking device includes two pairs of pivotally mounted arms which are cammed inwardly from each side of the card. The upper nose-shaped ends of the arms enter holes in the card so that the card cannot be removed without actuating the camming mechanism.

6 Claims, 3 Drawing Figures

CARD EDGE CONNECTOR LOCKING DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The invention disclosed herein relates to devices for removably locking printed circuit cards in card edge connectors. More particularly, the invention relates to zero insertion force card edge connectors having sliding cam members to cam the contact elements against the traces on the card and simultaneously to move the locking arms into holes in the card.

2. Prior Art

The invention disclosed herein is a novel improvement and a departure from at least the following:

| U.S. Pat. No. | Patentee | Class/Subclass |
|---|---|---|
| 3,573,706 | Haberlen | 339/17 |
| 3,970,353 | Kaufman | 339/75 MP |
| 4,017,138 | Evans | 339/75 MP |

Haberlen discloses a flat H-shaped leaf spring with the free ends of the upwardly extending legs having inwardly facing noses. The spring is positioned in the card edge connector so that a card enters in between the legs where upon the noses removably enter a hole in the card to retain it in the connector.

Kaufman discloses substantially the same type of locking device with differences being primarily in the way the device is positioned and retained in the connector. Both the Haberlen and Kaufman devices are shown as being used with high insertion force card edge connectors.

Evans discloses a locking device consisting of upright latch arms at each end of a connector having a vertically moving member which cams the contact elements into engagement with the traces on the card. The latch arms, each having facing hooks at the free ends, are cammed upwardly as the moving member is pushed down so that the hooks move in over the top edge of the card to retain it in the connector. Additionally, release arms are provided which lock the latch arms in the latched position and, upon being pushed inwardly, release the latch arms so that the card may be withdrawn.

SUMMARY OF THE INVENTION

The invention disclosed herein comprises a pair of locking arms pivotally mounted to the lower housing of a zero insertion force card edge connector. The free ends of the arms extend upwardly into the upper housing and are cammed in and out of the card slot as the upper housing is moved up and down. Nose-shaped free ends on the arms enter holes in the card so that the card cannot be withdrawn from the connector without moving the arms back out of the holes.

DESCRIPTION OF THE INVENTION

Figure 1:
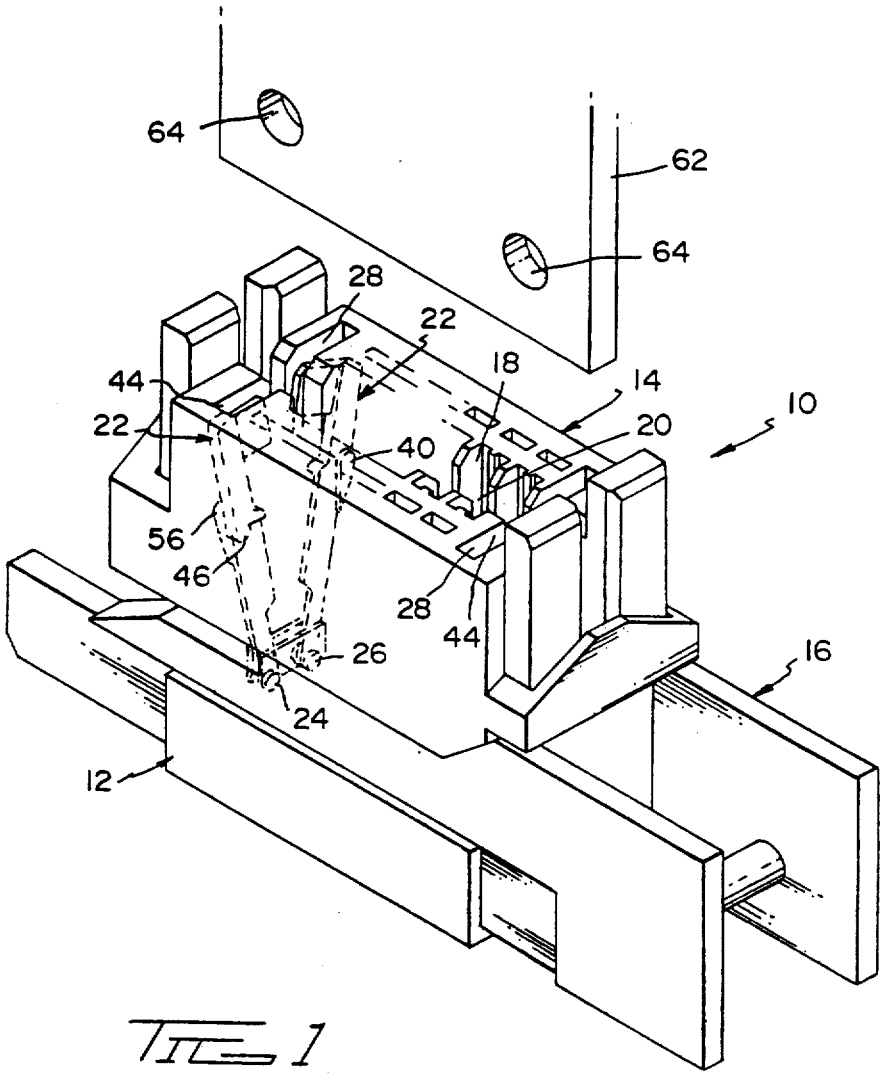
FIG. 1 is an isometric view showing a zero insertion force connector into which the locking device of the present invention is incorporated. The drawing shows, in phantom, one pair of locking arms of the locking device.

The invention disclosed herein is a locking device for removably locking circuit cards in a card edge connector. The locking device utilizes the mechanism of a zero insertion force connector 10 shown in the several drawings. This connector has a lower housing 12, a vertically moving upper housing 14, camming mechanism 16 which, moving longitudinally, raises or lowers the upper housing through a series of ramps (not shown). Further, a plurality of contact elements (not shown) are positioned in the connector. Upper beams (not shown) on the elements extend upwardly into cavities 18 in the upper housing and as the upper housing moves up, the beams are cammed in towards card slot 20 to bear against traces (not shown) on a card which may be positioned therein.

Under normal conditions, the beams exert enough pressure on the card so that it does not move. This is not true under high vibrational forces and the like which can cause the card to shift up and also move lengthwise in the slot. The latter motion must be guarded against to prevent short circuits and mismatch. Accordingly, the locking device of the present invention locks the card in the connector and prevents any motion whatsoever. Further, the cards cannot be withdrawn without taking a positive step; i.e., actuating camming mechanism 16.

The locking device includes two pairs of identical, elongated arms 22 with one pair positioned adjacent each end of card slot 20. FIG. 1 shows one pair of arms 22 in phantom.

Figure 2:
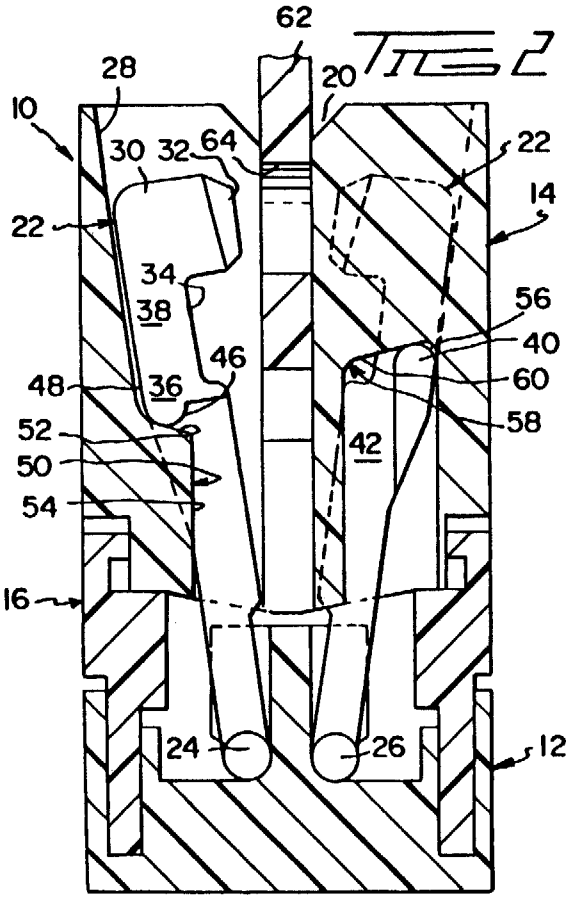
FIG. 2 is a cross-sectional view looking into the connector of FIG. 1 from an end and shows the locking arms cammed out of the card slot.

With reference to both FIGS. 1 and 2, each arm is pivotally mounted at its lower end 24 in lower housing 12 with the pivoting direction being towards and away from the card slot; i.e., normal to the longitudinal axis of connector 10. The mounting means may be pins 26 or the like.

Arms 20 extend upwardly into cavities 28 in the upper housing. Facing cavities are horizontally offset as shown in FIG. 1. The upper ends 30 of the arms include a nose 32 located on the inside edge 34 so that it projects in towards card slot 20.

Each arm includes a first follower 36 on side 38 and a second follower 40 on opposite side 42. With the arms being identical, the first follower 36 and side 38 on one arm; e.g., the left-hand arm in FIG. 2, faces in the same direction as the second follower and side 42 on the other, facing arm; e.g., the right-hand arm in FIG. 2. The followers are located just below upper ends 30 of the arms so that they may be actuated by cam means located on sidewalls 44 of cavities 28 in upper housing 14.

First follower 36 includes a downwardly facing, arcuate shoulder 46 and merging therewith, outwardly facing edge wall 48. First follower 36 rides along first cam surface 50 that includes a slanting but generally horizontal surface 52 and below that, a vertical wall 54.

Figure 3:
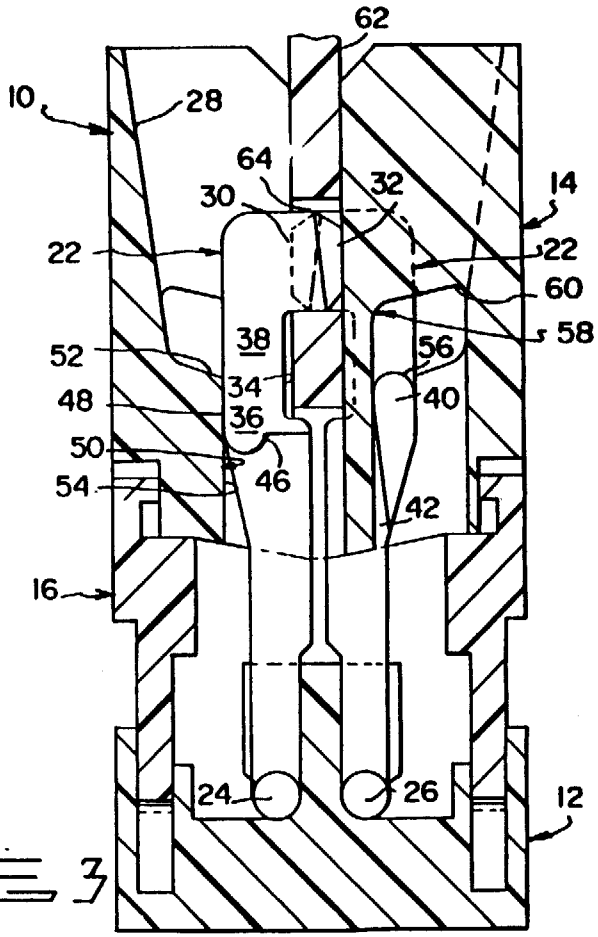
FIG. 3 is the same view as FIG. 2 but taken after the locking arms have been cammed into holes in a circuit card positioned in the card slot.

Second follower 40 includes an upwardly facing arcuate shoulder 56. This surface rides along U-shaped second cam surface 58, the bight 60 of which faces downwardly. As shown in FIGS. 2 and 3, the bight is slanting but generally horizontal.

To reiterate, each arm has a first follower 36 on one side and a second follower on the opposite side. Being identical, arms in opposing (but offset) cavities will offer different sides to a viewer looking into the connector from an end; e.g., FIGS. 2 and 3. Similarly, cavity walls on one side of the arms carry different cam surfaces.

The operation of the locking device of the present invention will now be explained.

In FIG. 2, connector 10 is in the open position; i.e., the upper beams of the contact elements (not shown) are back in their cavities in the upper housing so that circuit card 62 was inserted into slot 20 without force. Locking arms 22 are also retracted in their cavities 28.

To close connector 10, camming mechanism 16 (FIG. 1) is moved longitudinally. Upper housing 14 is thereby moved vertically upwardly. Cam surfaces (not shown) in the contact element cavities 18 cam the upper beams in against traces on card 62. Simultaneously, locking arms 22 are pivoted inwardly by first followers 36 riding against the upwardly moving first cam surfaces 50. The inwardly directed motion is brought about by arcuate shaped, downwardly facing shoulder 46 riding on slanting surface 52. Since the angle that surface makes relative to the horizontal is small, this inward motion is quite rapid. During this motion, noses 32 enter holes 64 in card 62. Since the cavities 28 and the arms are offset, the noses do not meet but rather slide by one another. As the upper housing continues to move, vertical wall 54 of cam surfaces 50 engages edge walls 48 of the first followers and holds the arms in the locking position shown in FIG. 3.

To open connector 10, camming mechanism is pushed back, causing upper housing 14 to move downwardly to the FIG. 2 position. As it moves down, the upper beams on the contact elements move away from the card as do locking arms 22 by means of second followers 40 riding along second cam surfaces 58. Second followers 40, riding up one side of the U-shaped cam surface 58, enters and travels along bight 60. The arms are thus pulled back and the noses retracted from holes 64. Note that the arms are held in towards the slot for substantially most of the downward travel and only near the end are the arms rapidly pulled back upon the arcuate shoulder 58 encountering and following bight 60. The card may be freely withdrawn from the slot.

One of the advantages of this invention is that if for some reason the connector is closed without a card in the slot, and then one tries to insert a card, it will hit the upper ends of the arms and not the upper beams which would, of course, damage them, probably beyond repair.

The foregoing detailed description has been given for clearness of understanding only, and no unnecessary limitations should be understood therefrom, as some modifications will be obvious to those skilled in the art.

We claim:

1. A locking device for use with card edge connectors of the type having a lower housing, a vertically moving upper housing, a card receiving slot and cavities normal to and opening into the slot, said locking device comprising:

a. a pair of identical, elongated arms, pivotally mounted at their lower ends to the lower housing with the pivotal motion being normal to the card receiving slot, said arms extending upwardly into the cavities in the upper housing and having on their upper ends a nose which faces towards the slot; and b. a first follower on one side of each arm and cooperative cam means on the cavity wall adjacent thereto to pivot the arms in towards the slot as the upper housing moves upwardly whereupon the noses enter holes in a card which may be in the slot to lock the card therein, and a second follower on the other side of each arm and cooperative cam means on the cavity wall adjacent thereto to pivot the arms out from the slot as the upper housing moves downwardly whereupon the noses are withdrawn from the holes to unlock the card.

2. The locking device of claim 1 wherein the first follower includes a downwardly facing, arcuate shoulder and the cooperating cam means on the cavity wall adjacent thereto includes a slanting but generally horizontal surface against which the arcuate shoulder follows to rapidly pivot the arm inwardly as the upper housing begins to move upwardly.

3. The locking device of claim 2 wherein the first follower further includes an edge wall extending upwardly from the arcuate shoulder and the cooperating means further include a vertical wall extending downwardly from the generally horizontal surface and against which the edge wall abutts to hold the arm inwardly towards the slot.

4. The locking device of claim 1 wherein the second follower includes an upwardly facing, arcuate shoulder and the cooperating cam means on the cavity wall adjacent thereto includes a downwardly facing, slanting but generally horizontal surface against which the arcuate shoulder follows to rapidly pivot the arm away from the slot as the upper housing nears the end of a downward travel.

5. The locking device of claim 4 wherein the second follower further includes an edge wall extending downwardly from the arcuate shoulder and the cooperating means further includes a vertical wall extending downwardly from the generally horizontal surface with the edge wall bearing against the vertical wall to hold the arm in towards the slot for substantially most of the downward travel of the upper housing.

*6. A locking device for use with card edge connectors of the type having a lower housing, a vertically moving upper housing, a card receiving slot and cavities normal to and opening into the slot, said locking device comprising:*

*a. a pair of identical, elongated arms pivotally disposed in the lower housing with the pivotal motion being normal to the card receiving slot, said arms extending upwardly into the upper housing and having on their upper ends a nose which faces towards the slot; and*

*b. a first follower on one side of each arm and cooperative cam means on the cavity wall adjacent thereto to pivot the arms in towards the slot as the upper housing moves upwardly whereupon the noses enter holes in a card which may be in the slot to lock the card therein, and a second follower on the other side of each arm and cooperative cam means on the cavity wall adjacent thereto to pivot the arms out from the slot as the upper housing moves downwardly whereupon the noses are withdrawn from the holes to unlock the card.*

* * * * *